United States Patent
Mheen et al.

(10) Patent No.: US 7,671,315 B2
(45) Date of Patent: Mar. 2, 2010

(54) IMAGE SENSOR AND METHOD OF DRIVING TRANSFER TRANSISTOR OF IMAGE SENSOR

(75) Inventors: Bong Ki Mheen, Daejeon (KR); Mi Jin Kim, Daejeon (KR); Young Joo Song, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 34 days.

(21) Appl. No.: 11/635,174

(22) Filed: Dec. 7, 2006

(65) Prior Publication Data

US 2007/0145239 A1  Jun. 28, 2007

(30) Foreign Application Priority Data

Dec. 8, 2005  (KR) ............... 10-2005-0119493
Oct. 11, 2006  (KR) ............... 10-2006-0098889

(51) Int. Cl.
*H01L 31/062* (2006.01)
*H04N 5/335* (2006.01)

(52) U.S. Cl. ............... 250/208.1; 348/308; 257/292
(58) Field of Classification Search ............ 250/208.1; 348/308; 257/292
See application file for complete search history.

(56) References Cited

U.S. PATENT DOCUMENTS

| | | | |
|---|---|---|---|
| 5,898,168 A | 4/1999 | Gowda et al. |
| 6,246,043 B1 | 6/2001 | Merrill |
| 6,307,195 B1 | 10/2001 | Guidash |
| 6,346,696 B1 | 2/2002 | Kwon |
| 6,741,283 B1 | 5/2004 | Merrill et al. |
| 7,110,030 B1 | 9/2006 | Kochi et al. |
| 2002/0122130 A1 | 9/2002 | Yamaguchi et al. |
| 2004/0031905 A1 | 2/2004 | Chan et al. |
| 2004/0036008 A1 | 2/2004 | Barna |
| 2005/0017155 A1 | 1/2005 | Manabe et al. |

(Continued)

FOREIGN PATENT DOCUMENTS

JP  10-093070 A  4/1998

(Continued)

OTHER PUBLICATIONS

International Search Report PCT/KR2006/005302 dated Mar. 20, 2007.

(Continued)

*Primary Examiner*—John R Lee
(74) *Attorney, Agent, or Firm*—Ladas & Parry LLP

(57) ABSTRACT

Provided is a 4-transistor CMOS image in which a driving condition or a pixel structure is changed so that a transfer transistor in a pixel operates in a pinch-off condition during reset and transfer operations in order to reduce dark current and fixed-pattern noise caused by a change in an operation condition of the transfer transistor and inter-pixel characteristic discrepancy. The image sensor includes a photosensitive pixel including a transfer transistor for transferring photon-induced charges created in a photodiode; and a voltage control unit for controlling a turn-on voltage applied to a gate of the transfer transistor to be lower than a floating diffusion node voltage plus the threshold voltage of the transfer transistor during a partial or entire section of a turn-on section of the transfer transistor such that the transfer transistor operates in a pseudo pinch-off mode.

17 Claims, 6 Drawing Sheets

U.S. PATENT DOCUMENTS

2007/0045681 A1 *   3/2007   Mauritzson et al. ......... 257/292

FOREIGN PATENT DOCUMENTS

| KR | 10-2003-0009625 | 2/2003 |
|---|---|---|
| KR | 10-2005-0038026 | 4/2005 |
| KR | 10-2005-0061608 | 6/2005 |
| KR | 1020060077529 A | 7/2006 |

OTHER PUBLICATIONS

"Large area interline CCD with low dark current." Chris Parks et al. Proceedings of SPIE-IS&T Electronic Imaging, SPIE vol. 5017. ©2003. pp. 167-175. no. month available.

* cited by examiner

IMAGE SENSOR AND METHOD OF DRIVING TRANSFER TRANSISTOR OF IMAGE SENSOR

CROSS-REFERENCE TO RELATED APPLICATION

This application claims priority to and the benefit of Korean Patent Application No. 2005-119493, filed Dec. 8, 2005, and 2006-98889, filed Oct. 11, 2006, the disclosure of which is incorporated herein by reference in its entirety.

BACKGROUND

1. Field of the Invention

The present invention relates to an image sensor and a method of driving a transfer transistor of the image sensor that transfers photon-induced charges, and more particularly, to an image sensor and a method of driving a transfer transistor of the image sensor that are capable of maintaining a depletion degree of charges in a photodiode when the photodiode is reset.

2. Discussion of Related Art

Image sensors may be classified into a charged coupled device (CCD) sensor and a complementary metal oxide semiconductor (CMOS) image sensor, which use electron-hole pairs separated by light having an energy higher than a silicon band gap, in which an amount of irradiated light is generally estimated by accumulating either electrons or holes.

The CMOS image sensor includes image pixels each having a photodiode and transistors, similar to a typical CMOS device. Image-signal processing and detecting circuits can be integrated in an external block of the pixel. This eliminates a need for an image-signal processing circuit included in a separate chip, allows a variety of image sensor structures to be adopted, and provides flexibility so that subsequent image processing is performed by hardware.

A 4-transistor pixel structure widely used to implement a CMOS image sensor is shown in FIG. 1. The 4-transistor pixel structure is composed of four transistors. A photodiode PD that is a photo-sensing unit and four NMOS transistors constitute one unit pixel. Among the four NMOS transistors, a transfer transistor Tx serves to transfer photo charges generated by the photodiode PD to a diffusion node region 131, a reset transistor Rx serves to discharge charges from the diffusion node region 131 or the photodiode PD so that a signal is detected, a drive transistor Dx serves as a source follower transistor, and a switching transistor Sx is used for switching/addressing. The transfer transistor Tx may be implemented by a gate, a gate oxide layer, and a p-type substrate, the photodiode PD may be generally implemented by an n– or no-doped region and a surface p-doped region, and the diffusion node 131 may be implemented by an n+ doped region.

In FIG. 1, the photodiode PD receiving light and a capacitor 118 connected parallel to the photodiode PD constitute a light-receiving unit, and the transfer transistor Tx serves to transfer electrons generated by photons to the diffusion node 131.

The transfer transistor Tx serves as a transmission channel that transfers electrons generated from a surface of the photodiode PD to the diffusion node 131 or performs a reset function to completely remove electrons from the photodiode PD in response to a voltage applied to its gate. The diffusion node 131 includes a diffusion capacitor 114 and a gate capacitor of the drive transistor Dx. The diffusion node 131 is reset by the reset transistor Rx. That is, the diffusion node 131 is reset before receiving the electrons from the photodiode PD region, or a reset voltage is applied to the diffusion node 131 to reset the photodiode PD region. A voltage is applied to a gate 141 of the switching transistor Sx in order to select one row for a two-dimensional image. Each pixel is biased by a current source 150, which activates the drive transistor Dx and the switching transistor Sx so that a voltage at the diffusion node 131 is read out to an output node 142.

In a CMOS image sensor having the 4-transistor pixel shown in FIG. 1, photon-induced carriers accumulated in the photodiode after the photodiode is reset are transferred to the floating diffusion node, causing a voltage drop across the diffusion node, and thus the voltage drop is used to detect the amount of the photon-induced carriers. In this case, the transfer transistor must perform uniform reset and transfer operations in order to accurately and uniformly detect the amount of the accumulated photon-induced carriers. A variety of structures of a conventional 4-transistor pixel including a fully reset pinned photodiode to allow a transfer transistor to perform uniform reset and transfer operations are disclosed. The pinned photodiode uses a state where all movable charges in the photodiode are completely depleted and a voltage is not changed any more. Ideally, a photodiode voltage is always pinned into a constant value irrespective of an external bias such as a voltage at the floating diffusion node. Therefore, the reset and transfer conditions for the transfer transistor becomes always constant.

However, in the conventional CMOS image sensor having a 4-transistor pixel, a reduced operating voltage or a changed process condition may always change reset and transfer conditions depending on a relationship between the gate voltage of the transfer transistor and the voltage at the floating diffusion node.

Specifically, in a conventional driving method using a power supply voltage (VDD) as a transistor turn-on voltage, when the transfer transistor is reset, a voltage at the floating diffusion node is equal to the gate voltage VDD of the reset transistor minus a threshold voltage value threshold voltage (Vth) of the reset transistor RX (VDD−Vth). This value automatically allows a difference between the gate voltage VDD of the transfer transistor and the voltage at the floating diffusion node to be equal to the threshold voltage Vth. Generally, since the reset and transfer transistors are formed in the same doping condition on a substrate, they have a similar threshold voltage Vth. In this case, a state in the condition corresponds to an edge between a pinch-off state region, in which a transfer transistor's edge at the floating diffusion node begins to be turned on according to the definition of the threshold voltage Vth, and a linear operation region. At a time when the transfer transistor's edge at the floating diffusion node is turned on, a certain amount of electrons may promptly move from the floating diffusion node to the channel region of the transfer transistor. Accordingly, the voltage at the floating node is significantly changed due to the capacitance. Furthermore, the amount of electrons from the floating diffusion node significantly changes in a small difference in threshold voltage between the transfer transistor and the reset transistor. Such a nonuniform amount of electrons from the floating diffusion node causes irregularity of the reset condition, thus deteriorating the quality of an image.

Unstable reset and transfer operations of the transfer transistor may cause two typical problems of increased dark current and increased fixed pattern noise.

In the reset operation, since the reset transistor Rx is turned on the floating diffusion node has a low impedance with respect to the ground, the voltage is substantially the same VDD−Vth as the power supply voltage VDD. In the transfer operation, since the reset transistor Rx is turned off and the floating diffusion node has a high impedance with respect to the ground, electrons in the channel of the transfer transistor flow into the floating node (clock feedback), so that the voltage at the floating node becomes lower than the voltage VDD−Vth. Additionally, the gate voltage of the transistor increases an ON voltage according to boosting condition. In this process, the floating node voltage differs between the reset and transfer operations. This different voltage conditions have not caused any trouble because a completely depleted (i.e., completely reset) pinned photodiode is employed, i.e., the pixel is driven after the photodiode is completely depleted. The use of the pinned photodiode can also suppress dark current and other noises.

However, as a modern semiconductor process and device is scaled down and an operating voltage is reduced, the floating diffusion node voltage gets gradually lower. Accordingly, a pinning voltage of a pinned photodiode gets lower, thereby deteriorating a pixel characteristic such as well capacity.

Further, a voltage barrier necessarily exists between the pinned photodiode and the channel of the transfer transistor to some extent. To suppress the effect of the barrier when the transfer transistor is turned on, a pinning voltage is made significantly different from the voltage at the floating diffusion node. When the barrier is not sufficiently reduced, the pinned photodiode is not completely reset, which may cause more severe problems. That is, when an operating voltage indicated as the power supply voltage VDD is reduced, a difference between the pinning voltage and the floating diffusion node voltage is reduced. In addition, the well capacity may be lowered and resetting (e.g., depletion) may be insufficient.

To solve the problems, in a conventional technique, a voltage at a floating diffusion node forcibly rises from a typical voltage VDD−VTH to the power supply voltage VDD using a boosting circuit. In another conventional technique, the floating diffusion node voltage rises to the power supply voltage VDD sufficiently and quickly using a reset transistor Rx of a PMOS type, not a conventional NMOS type.

However, the voltage boosting circuit applies a voltage over a normal operation condition, which may degrade the reliability of a gate oxide. When a PMOS transistor is used as a reset transistor Rx, it occupies a wider area than an NMOS transistor. Accordingly, a fill factor is reduced to deteriorate a characteristic of the device, and two times more noise than in an NMOS transistor is generated, as known in the art. Further, this approach has a limitation of characteristic enhancement in a complete reset condition.

SUMMARY OF THE INVENTION

The present invention is directed to an image sensor and a method of driving a transfer transistor of the image sensor that are capable of effectively suppressing a noise such as dark current while reducing dependency on a state of a photodiode.

The present invention is also directed to an image sensor and a method of driving a transfer transistor of the image sensor that are capable of performing reset and transfer operations even though a photodiode is not completely reset.

The present invention is also directed to an image sensor and a method of driving a transfer transistor of the image sensor in which a characteristic of a photodiode can be improved even when the photodiode is designed as a completely reset type.

The present invention is also directed to an image sensor and a method of driving a transfer transistor of the image sensor in which a transfer transistor operates in a pseudo pinch-off state.

The present invention is also directed to implementation of an image sensor and a method of driving a transfer transistor of the image sensor that are capable of effectively suppressing noise such as dark current in low operating voltage and/or at low cost.

One aspect of the present invention provides a method of driving a transfer transistor of an image sensor including: applying a pseudo pinch-off voltage to a gate of the transfer transistor in order to reset a photodiode; applying a turn-off voltage to the gate of the transfer transistor to block the photodiode during light accumulation; and applying a transfer voltage to the gate of the transfer transistor in order to transfer photon-induced charges accumulated in the photodiode.

One aspect of the present invention provides a method of driving a transfer transistor of an image sensor including: applying a reset voltage to a gate of the transfer transistor in order to reset a photodiode; applying a turn-off voltage to the gate of the transfer transistor to block the photodiode during light accumulation; and applying a pseudo pinch-off voltage to the gate of the transfer transistor in order to transfer photon-induced charges accumulated in the photodiode.

One aspect of the present invention provides an image sensor including: a photodiode; and a transfer transistor for transferring photon-induced charges created by the photodiode to a floating diffusion node, wherein the floating diffusion node and a channel of the transfer transistor are separated by a depletion region when the transfer transistor is turned on, so that the transfer transistor operates in a pseudo pinch-off mode.

Here, the floating diffusion node and the channel of the transfer transistor may be separated by adjusting a process condition or layout for an image sensor manufacturing process.

Particularly, when the sensor comprises a reset transistor for resetting the floating diffusion node, the threshold voltage of the transfer transistor or the reset transistor may be changed through a process condition modification so that the transfer transistor operates in a pseudo pinch-off mode, or the threshold voltage of the transfer transistor may be made higher than the threshold voltage of the reset transistor by ion implantation or oxide layer thickness adjustment.

The floating diffusion node and the channel of the transfer transistor may be separated by the depletion region by controlling a channel voltage of the transfer transistor to be lower than a voltage at the floating diffusion node during a partial or entire section of the turn-on section of the transfer transistor. That is, signal voltages applied to transfer transistor and/or the floating diffusion node may be adjusted to implement the pseudo pinch-off mode.

In this case, the image sensor may comprise a transfer transistor for transferring photon-induced charges from the photodiode to the floating diffusion node, wherein the channel voltage of the transfer transistor is controlled lower than a voltage at the floating diffusion node during a partial or entire section of the turn-on section of the transfer transistor such that the transfer transistor operates in a pseudo pinch-off mode.

The channel voltage of the transfer transistor may be equal to the turn-on voltage applied to the gate minus the threshold voltage of the transfer transistor. Accordingly, in order to control the channel voltage of the transfer transistor to be lower than the voltage at the floating diffusion node, the sensor may comprise a voltage control unit for controlling a turn-on voltage applied to the gate of the transfer transistor to be lower than the floating diffusion node voltage plus the threshold voltage of the transfer transistor.

Accordingly, the channel voltage of the transfer transistor that is the gate turn-on voltage minus the threshold voltage of the transfer transistor becomes lower than the voltage at the floating diffusion node, thereby blocking electrons from flowing from the floating diffusion node to the transfer transistor channel.

Methods, at the voltage control unit, of controlling the turn-on voltage applied to the gate of the transfer transistor to be lower than the floating diffusion node voltage plus the threshold voltage of the transfer transistor may include a method of applying a switching signal having a lower pseudo pinch-off voltage than a normal gate turn-on voltage to the gate of the transfer transistor so that the gate turn-on voltage of the transfer transistor is lowered while a bias voltage of the reset transistor remains normal; and a method of applying a slightly higher reset voltage than the power supply voltage to the gate and/or source of the reset transistor and applying a normal turn-on voltage to the transfer transistor in order to increase a voltage applied to the floating diffusion node.

Unlike a conventional technique adapted to fully deplete a photodiode, in the present invention, the amount of charge remaining in the channel region of the transfer transistor is not affected by other charges when the transfer transistor is turned on. Accordingly, when the photodiode is transfer state, the amount of charge remaining in the photodiode gets constant, and an influence on the amount of charge in the photodiode and the amount of charge transferred by the transfer transistor is minimized, thus reducing noise and dark current. In the present invention, when turned on, the transfer transistor operates at a predetermined pseudo pinch-off voltage so that the amount of charge remaining in the source of the transfer transistor is unchanged.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, exemplary embodiments of the present invention will be described in detail. However, the present invention is not limited to the embodiments disclosed below, but can be implemented in various forms. The following embodiments are described in order for this disclosure to be complete and enabling of practice of the invention by those of ordinary skill in the art.

Although in the following embodiments of the present invention, the photosensitive pixel will be described as being applied to a 4-transistor CMOS image sensor, it may be applied to other image sensors, e.g., a low-voltage output sensing circuit of a CCD, comprising a photodiode and a transistor for transferring photon-induced charges generated by the photodiode without departing from the scope of the present invention.

First Exemplary Embodiment

An image sensor of this embodiment includes: a photodiode; a photosensitive pixel including a transfer transistor for transferring photon-induced charges created in the photodiode to a floating diffusion node; and a voltage control unit for applying a switching signal having a pseudo pinch-off voltage lower than the power supply voltage or a rising time that is two times or greater than the minimum rising time, to the gate of the transfer transistor during a partial or entire section of a turn-on section of the transfer transistor. Preferably, the pseudo pinch-off voltage ranges from a value several hundreds of mV lower than the power supply voltage to a half the power supply voltage.

Figure 1:
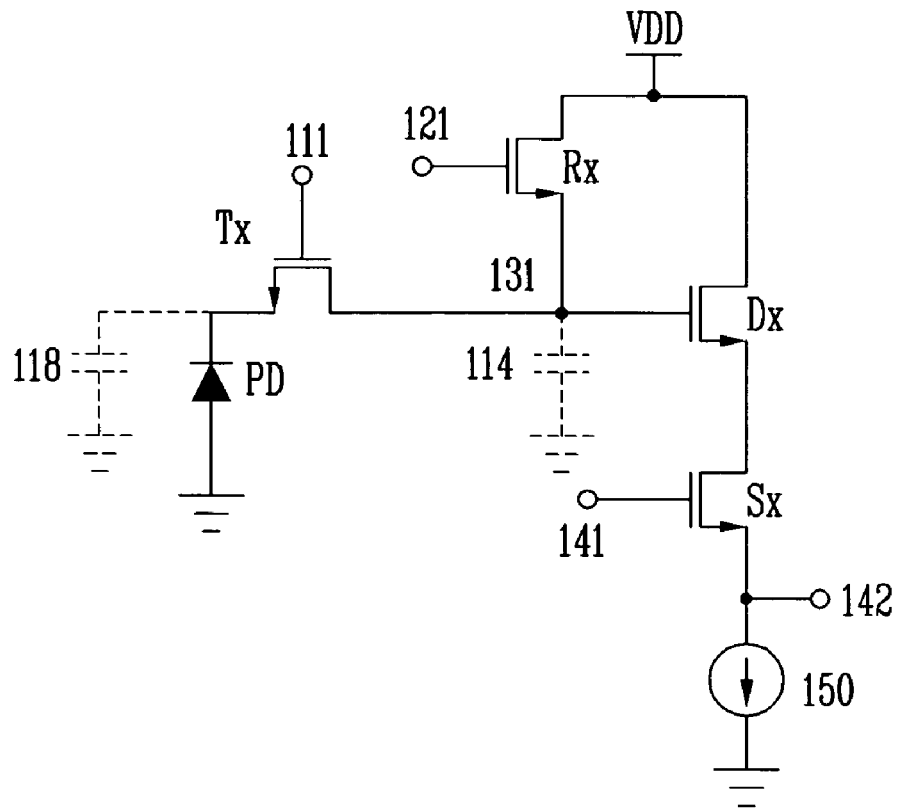
FIG. 1 is a circuit diagram illustrating a structure of a typical 4-transistor CMOS image sensor.

In the case where this embodiment is implemented by a CMOS image sensor, it may be applied to the 4-transistor pixel structure shown in FIG. 1. Once a pseudo pinch-off voltage value to be generated by a voltage control unit is determined, the control unit may be implemented using a variety of conventional ways. The voltage control unit will be briefly described later.

Figure 2:
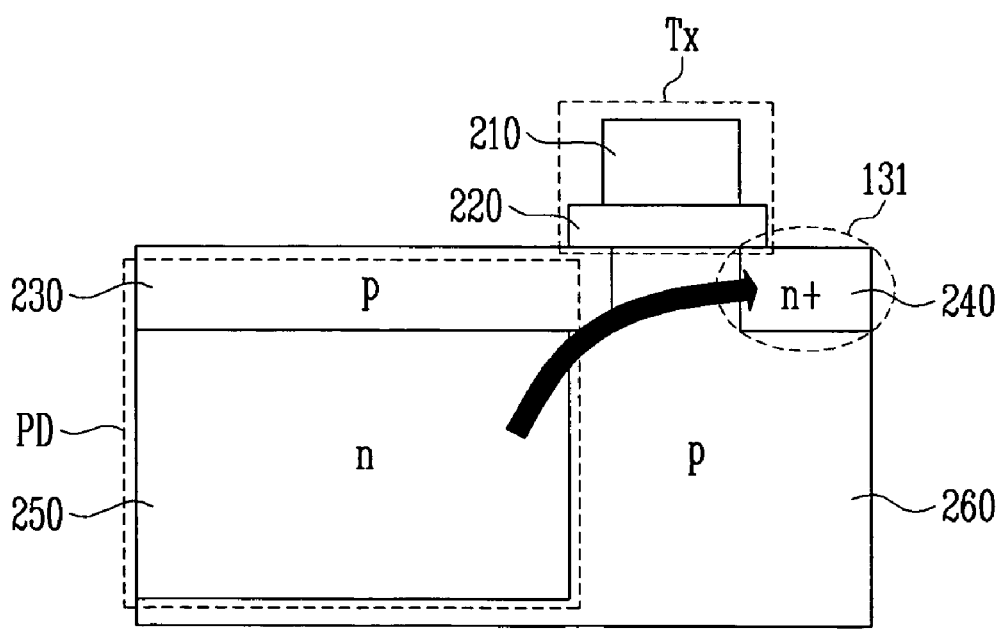
FIG. 2 is a cross-sectional view illustrating a photodiode and transfer transistor region of a CMOS image sensor according to an exemplary embodiment of the present invention.

FIG. 2 shows a photodiode and transfer transistor of a CMOS image sensor having a typical structure to which a method of driving a transfer transistor according to the exemplary embodiment may be applied. In this embodiment, a switching signal applied to a gate electrode of the transfer transistor is adjusted in order to obtain optimal performance of the sensor.

Figure 4:
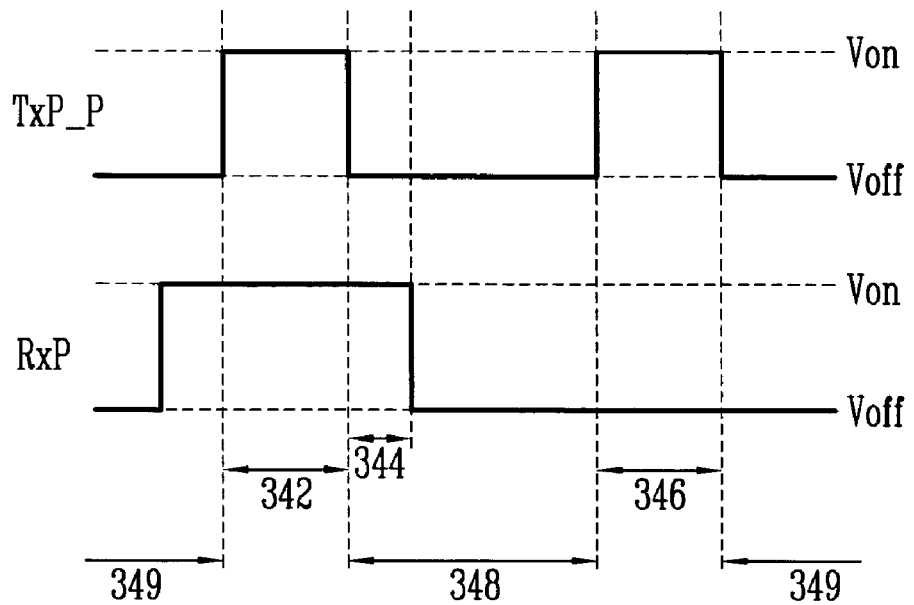
FIG. 4 is a timing diagram illustrating a method of driving a transfer transistor of a conventional image sensor.

FIG. 4 shows a switching signal applied to a gate of a conventional transfer transistor. As shown in FIG. 4, a switching signal RxP of a reset transistor and a switching signal TxP_P of the transfer transistor have the same turn-off level (Von and Voff). Here, Von indicates the power supply voltage VDD of FIG. 1 and Voff indicates a ground voltage.

Figure 5:
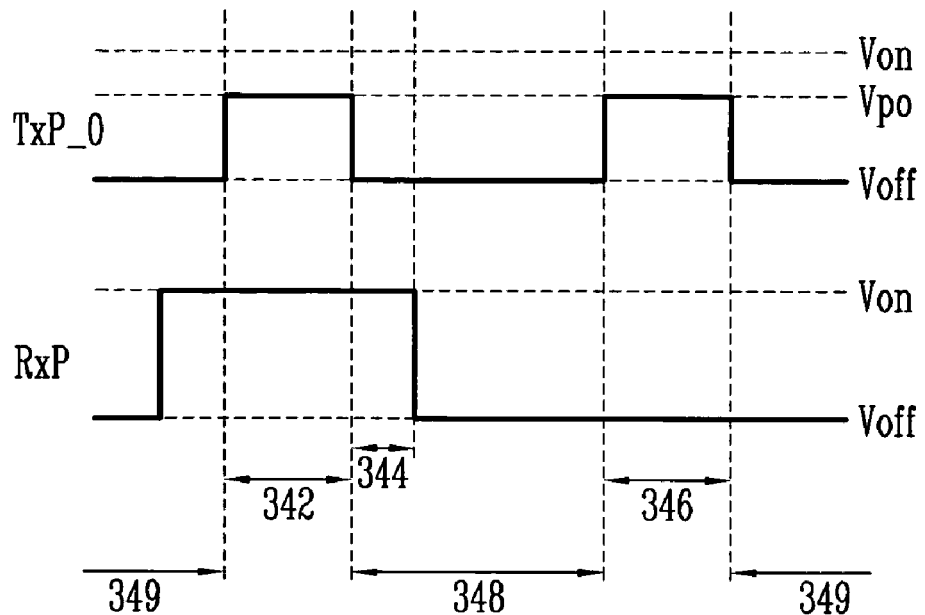
FIG. 5 is a timing diagram illustrating a method of driving a transfer transistor of an image sensor according to an exemplary embodiment of the present invention.

FIG. 5 shows a switching signal applied to a gate of a transfer transistor according to the exemplary embodiment. The switching signal includes a photodiode reset section 342, a diffusion node reset section 344, a photon-induced electron accumulation section 348, and a section 346 in which electrons accumulated in a photodiode is transferred to a diffusion node. The signal further includes a read section 349 in which several pixels are sequentially read. The read section 349 is generally shorter than the photon-induced electron accumulation section 348.

A method of driving a transfer transistor of the image sensor according to this embodiment using the shown waveform includes the steps of: applying a pseudo pinch-off voltage to the gate of the transfer transistor in order to reset a photodiode; applying a turn-off voltage to the gate of the transfer transistor to block the photodiode during accumulation; and applying a transfer voltage to the gate of the transfer transistor in order to move photon-induced charges accumulated in the photodiode. In a case of a 4-transistor pixel, the method may further include the step of applying a turn-off voltage to the gate of the transfer transistor while the transferred photon-induced charges are being read after applying the transfer voltage.

The pseudo pinch-off voltage is applied in the photodiode reset section 342, the turn-off voltage is applied in the photodiode accumulation section 348, the transfer voltage is applied in the photon-induced electron transfer section 346, and the turn-off voltage is applied in the photodiode read section 349 in read operation.

Applying the pseudo pinch-off voltage corresponds to a technical spirit of the present invention in which in a pseudo pinch-off state, charges in the channel of the transfer transistor are not affected by charges in other portions, e.g., charges in the floating node. When a high voltage is applied to the transfer transistor, the channel of the transfer transistor is connected to the floating node so that charges in the floating node flow into the channel of the transfer transistor. This affects resetting the transfer transistor and moving the photon-induced charges and thus deteriorates several characteristics of a pixel.

As the pseudo pinch-off voltage is applied using the turn-on voltage of the transfer transistor, the above problems can be solved and the performance of the image sensor can be prevented from being deteriorated due to deviations in a manufacture process.

Meanwhile, when the reset transistor and the transfer transistor have the same threshold voltage, the pseudo pinch-off voltage is slightly (preferably, 0.1V to VDD/2) lower than a gate voltage of the reset transistor. This pseudo pinch-off voltage enables reset operation and photon-induced charge transfer operation. Accordingly, the amount of charge in the channel of the transfer transistor is less affected by the amount of other charges, e.g., the amount of charge in the floating node, as described above. In a conventional implementing method, a power supply voltage VDD is applied to both gates of the reset transistor and the transfer transistor, which implies that since the transfer transistor and the reset transistor have the same threshold voltage, the amount of charge in the channel of the transfer transistor is sufficiently affected by the amount of charge in the floating node.

When a conventional method of applying a driving signal is used, the same effect can be obtained by changing a threshold voltage of the transfer transistor and the reset transistor. Particularly, the gate voltage of the transfer transistor gets smaller than that of the reset transistor by making the threshold voltage of the transfer transistor higher than that of the reset transistor by modifying a manufacturing process or bias, such that the turn-on voltage applied to the gate of the transfer transistor is forcibly lower than the voltage of the floating diffusion node plus the threshold voltage of the transfer transistor.

Further, since the amount of the non-reset charge is always constant due to a nature of the pseudo pinch-off state and is less affected by other environmental factors, a constant value corresponding to the amount of the non-reset charge may be cancelled to obtain a more accurate photosensitive value. However, a too low gate voltage of the transfer transistor obstructs sufficiently reducing a barrier between the photodiode and the channel of the transfer transistor, thus degrading transferring or resetting capability.

A term pseudo pinch-off state refers to a state physically similar with a pinch-off mode of operation of the MOS transistor. Preferably, a pseudo pinch-off gate voltage for obtaining the pseudo pinch-off state ranges from a hundreds of mV lower value than the power supply voltage corresponding to VDD of FIG. 1 to a half the power supply voltage.

In FIG. 5, in the electron transferring section 346, the pseudo pinch-off voltage may be applied to the gate of the transfer transistor, such that the pseudo pinch-off state is stabilized, and the amount of charge that do not move from the photodiode to the floating diffusion node remains unchanged. Thus, it is possible to increase the accuracy of the photo electrons transferring operation. In addition, the amount of remaining charge upon resetting and the amount of remaining charge upon reading get constant, and a separate CDS circuit may not be required. Thus, it is possible to more simply manufacture a CMOS image sensor. In this case, the pseudo pinch-off voltage in the photo electrons transferring section 346 gets the same as or different from the pseudo pinch-off voltage in the reset section 342. In the reset section 342, the reset voltage of the transfer transistor can range from VDD to VDD/2.

Alternatively, in the transfer operation, the power supply voltage VDD or another voltage may be applied in the reset section 346, as in a conventional technique, in order to obtain sufficient charges from the photodiode.

Meanwhile, in the case where the reset operation can be sufficiently accomplished using the pinned photodiode, a normal turn-on voltage may be applied in the reset section 342 and the pseudo pinch-off voltage may be applied only in the photo electrons transferring section 346.

Meanwhile, a rising time (i.e., leading time) of the switching signal waveform affects the pseudo pinch-off state. The greater the rising time, the more a reduced amount of the voltage applied to the transfer transistor gate can be reduced. That is, the signal having a small slope makes the pseudo pinch-off state more stable.

Figure 6:
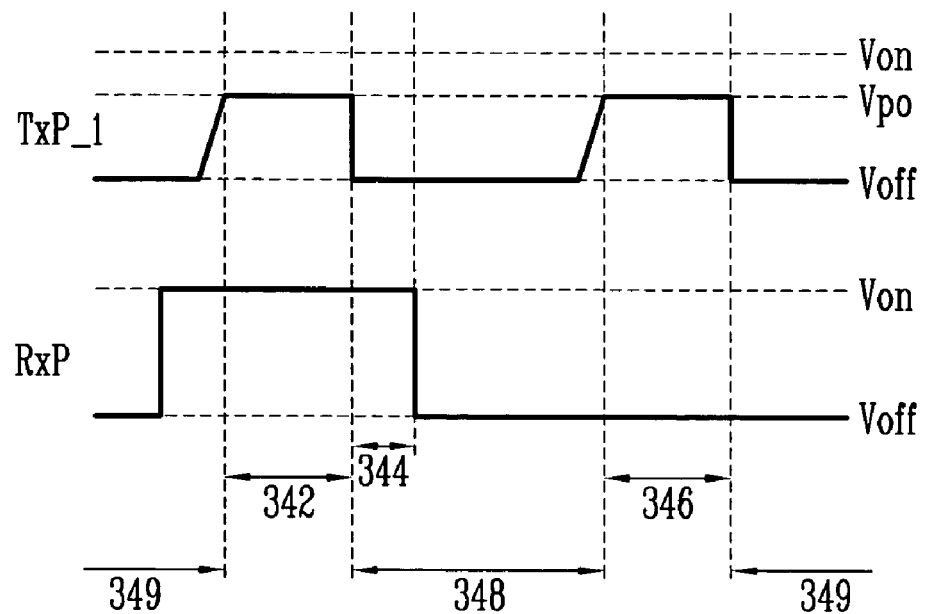
FIG. 6 is a timing diagram illustrating a method of driving a transfer transistor of an image sensor according to another exemplary embodiment of the present invention.

FIG. 6 shows another embodiment of a switching signal gate to apply a smoother pseudo pinch-off voltage in order to obtain a more stabilized pseudo pinch-off state. Upon shifting from section 349 to section 342, the switching voltage TxP_1 of the transfer transistor rises from a turn-off voltage Voff to a pseudo pinch-off voltage Vpo. In this case, a separate delay circuit increases the rising time of the switching signal to be two times the rising time of an output signal of a normal switching control unit (hereinafter, referred to as a minimum rising time) unless a signal output means cannot work.

Figure 7:
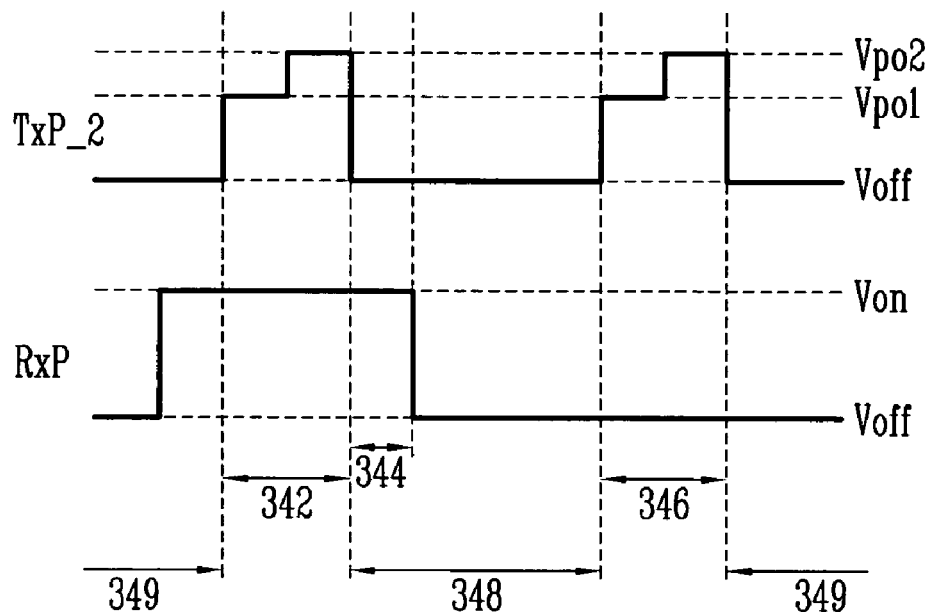
FIG. 7 is a timing diagram illustrating a method of driving a transfer transistor of an image sensor according to still another exemplary embodiment of the present invention.

FIG. 7 shows another embodiment of a switching signal to apply a step-shaped pseudo pinch-off voltage to a gate in order to obtain a more stabilized pseudo pinch-off state. Upon shifting from section 349 to section 342, the switching voltage TxP_1 of the transfer transistor rises from a turn-off voltage Voff to a pseudo pinch-off voltage Vpo. In FIG. 7, the switching signal rises to a first pseudo pinch-off voltage Vpo1 and then to a second pseudo pinch-off voltage Vpo2 after a predetermined time elapses. The switching signal may be applied in steps, such as in three or more steps. Alternatively, the switching signal may rise in steps to the power supply voltage VDD as a final value. Even when the gate voltage sequentially rises in steps to the same level as the power supply voltage VDD, the transfer transistor remains in a pseudo pinch-off state to some extent.

This implementation is intended to reduce a risk of no pseudo pinch-off state when the gate voltage of the transfer transistor rapidly rises. Generally, the switching signal of the transfer transistor may be adjusted in a multi-step by providing an additional function to a digitally-driven decoder for a row of a pixel. Driving the transfer transistor in the multi-level is helpful to make the transfer transistor in the pseudo pinch-off state. That is, in the methods of FIGS. 6 and 7, a rising width per hour of the switching signal applied to the gate of the transfer transistor is reduced to suppress the rise of the channel voltage compared to the rise of the floating diffusion (FD) node voltage as much as possible, so that the transfer transistor stays in a pseudo pinch-off region.

Although the final turn-on voltage has been shown in FIGS. 6 and 7 as being lower than a conventional turn-on voltage by allowing the turn-on to rise to a rising time that is two times or greater the minimum rising time smoothly or in steps, the final turn-on voltage may be the same as the conventional turn-on voltage (power supply voltage) in order to obtain the pseudo pinch-off state of the transfer transistor as intended by the present invention. This is because when a rising speed of the voltage applied to the gate of the transfer transistor is low, the channel voltage follows the gate voltage with a constant delay time in which the transfer transistor becomes in the pseudo pinch-off state.

Although not shown in detail, the waveform of FIG. 7 may include all the features of FIGS. 6 and 7. That is, two or more step-shaped pseudo pinch-off voltages are sequentially applied and the rising time thereof may expand by using a separate delay means.

Figure 10:
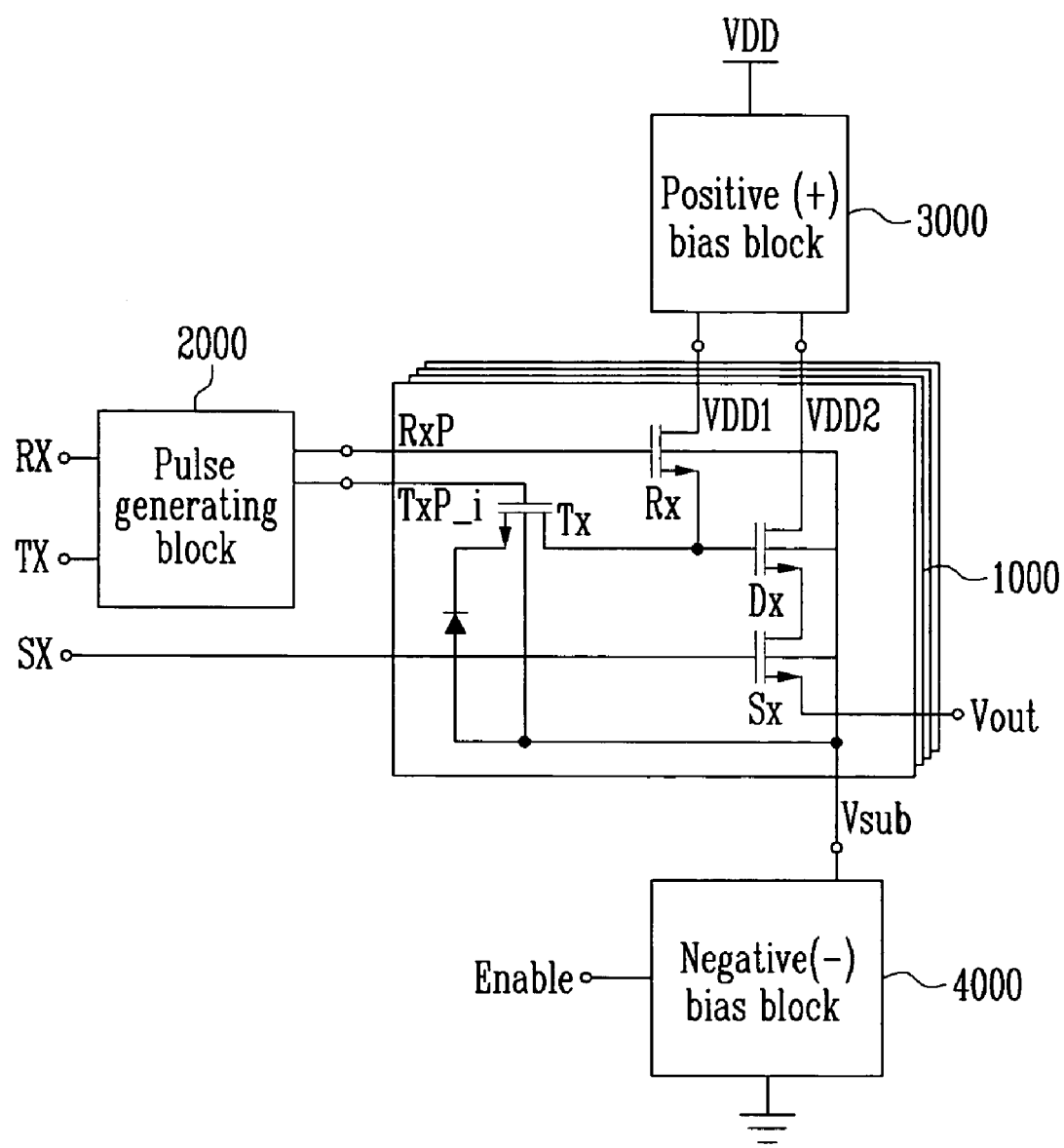
FIG. 10 is a block diagram illustrating a structure of a CMOS image sensor according to an exemplary embodiment of the present invention.

FIG. 10 shows a structure of the image sensor including a photosensitive pixel and a relevant control block according to this embodiment. A voltage control unit may be implemented by a pulse generating block 2000.

The pulse generating block 2000 receives RX and TX signals applied to a conventional image sensor to generate Vrx and Vtx signals as shown in FIGS. 5 to 9, so that the turn-on voltage applied to the gate of the transfer transistor gets lower than that of the floating diffusion node.

Second Exemplary Embodiment

An image sensor of this embodiment includes a transfer transistor for transferring photon-induced charges created in the photodiode to a floating diffusion node, and a reset transistor for resetting the floating diffusion node, in which, a voltage applied to a drain and/or gate of the reset transistor is changed to control the channel voltage of the transfer transistor to be lower than the floating diffusion node voltage so that the transfer transistor operates in a pseudo pinch-off mode.

Here, the turn-on voltage of the transfer transistor may be a power supply voltage. Preferably, the voltage applied to the drain and/or gate of the reset transistor may range from a value several hundreds of mV higher than the power supply voltage to a value 1.5 times higher than the power supply voltage.

When this embodiment is implemented by a CMOS image sensor, it may be applied to the 4-transistor pixel structure shown in FIG. 1. It can be seen that even in the image sensor of this embodiment, a voltage at the floating diffusion node is higher than that of a channel of the transfer transistor when the transfer transistor is turned on. The resulting operation and effects have been sufficiently described in the first embodiment and thus a description thereof will be omitted herein.

In this embodiment, when the gate turn-on voltage, which is the power supply voltage as in a convention technique, is applied to the gate of the transfer transistor and the transfer transistor is turned on, the voltage of the floating diffusion node increases for a pseudo pinch-off state. Methods of resetting the floating diffusion node into a higher reset voltage than the power supply voltage as described above include a method of increasing the gate voltage of reset transistor to be higher than the power supply voltage when the transfer transistor is reset (i.e., turned on), and a method of increasing gate and drain voltages of the rest transistor to higher than the power supply voltage when the transfer transistor is reset.

When a power supply voltage is applied to a gate and drain of an NMOS transistor to be turned on, a source voltage is the gate voltage minus the threshold voltage. Accordingly, when the gate voltage increases, the source voltage correspondingly increases to the drain voltage (power supply voltage) as a limit. In the case where the source voltage should get higher than the limit, both gate and drain voltages of the reset transistor must increase. When the transfer transistor and the reset transistor have the same threshold voltage, only the turn-on gate voltage of the reset transistor may increase to a hundreds of mV level higher than the power supply voltage.

FIG. 10 shows a structure of the image sensor including the photosensitive pixel and the relevant control block according to this embodiment. A voltage control unit is a positive (+) bias block 3000 in the case of the former method and is a pulse generating block 2000 in the case of the latter method.

In the case of the former method, the positive (+) bias block 3000 may be implemented for example by a capacitor-based boosting circuit and generates a higher voltage than the power supply voltage and applies it to the drain of the reset transistor.

In the case of the latter method, the pulse generating block 2000 uses, for example, a boosting circuit to adjust the reset turn-on voltage Vrx applied to the gate of the reset transistor Rx to be higher than the power supply voltage. That is, the pulse generating block 2000 performs steps of applying a turn-on voltage higher than the power supply voltage to the gate of the reset transistor in order to reset the photodiode; and applying a turn-off voltage to the gate of the reset transistor in the photo electrons accumulating section, the transferring section, and the reading section.

Third Exemplary Embodiment

Figure 3:
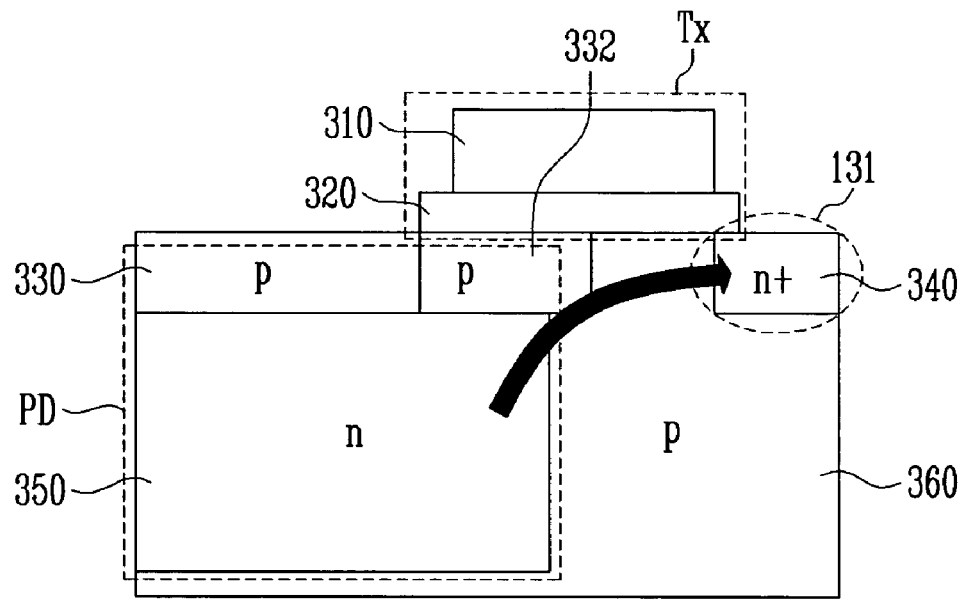
FIG. 3 is a cross-sectional view illustrating a photodiode and transfer transistor region of a CMOS image sensor according to another exemplary embodiment of the present invention.

FIG. 3 shows a structure of a photodiode and a transfer transistor of a CMOS image sensor having an enhanced structure to which a method of driving a transfer transistor according to this exemplary embodiment may be applied. In this embodiment, a switching signal applied to the gate of the transfer transistor includes a turn-on voltage that is enhanced as in the first embodiment, and a turn-off voltage that is a lower negative offset voltage than a ground voltage in order to optimize the performance of the image sensor.

A method of applying a pseudo pinch-off voltage and the resulting effect are the same as in the first embodiment, and thus the enhanced structure of the transfer transistor, a method of applying a negative offset voltage, and the resulting effect will be described herein.

Only the photodiode PD, the transfer transistor Tx, and the floating diffusion region 131 of the 4-transistor pixel are shown in FIG. 3. The transfer transistor Tx includes a gate 310, a gate oxide layer 320, and a p-type substrate 360, the photodiode region PD includes a photodiode (n) doped region 350 and a surface p doped region 330, and the diffusion node 340 is an n+ type node. In this case, a p doped region 332 contiguous to the transfer transistor is formed adjacent to the surface p doped region 330. In this embodiment, holes are accumulated in the p doped region 332 so that the performance of the image sensor is improved.

In the accumulation section (348 of FIG. 8), a constant negative offset voltage Vos is applied to the gate of the transfer transistor 310, so that holes are accumulated in the p doped region 332 contiguous to the transfer transistor via the gate oxide layer 320. In this case, a trap is inactivated in the p doped region 332 contiguous to the transfer transistor and electrons-hole pairs are reduced. Thus, dark current is reduced. In addition, the gate 310 voltage applied while the transfer transistor is turned off increases the voltage barrier beneath the gate oxide layer 320 and, in turn, well capacity of electrons that can be accumulated in the photodiode.

There may be several methods of manufacturing the transfer transistor having the shown structure. Among them, in a manufacturing method capable of minimizing a modification of a conventional image sensor manufacturing process, a p-type layer 330 of a typical photodiode is formed by forming a gate oxide and implanting a p-type dopant, such as boron, into the gate oxide. In this case, a subsequent annealing process causes a boundary of the implanted dopant to be diffused below the gate oxide. Researchers have tried to minimize the diffusion of the dopant. However, in this embodiment, the p-type region 332 overlapping the gate electrode 310 is formed by maximizing the diffusion of the dopant. That is, the region 332 overlapping the gate electrode 310 among the two p-type layers 330 and 332 of the photodiode is formed by horizontal diffusion of the dopant.

In another method of manufacturing a transfer transistor of this embodiment, the p-type region 332 overlapping the gate electrode 310 may be formed to be integral with the p-type region 330 of the photodiode or may be formed independently, through a separate lithographic process and a subsequent stacking process before the gate electrode 320 is formed.

In the latter case, the p-type doping region 332 is doped in a different pattern from the surface p doped region of the photodiode. In general, the surface p doped region of the photodiode is formed by somewhat complex doping, including double or more doping, for photosensitive efficiency and/or reset efficiency. Since the p-type doping region 332 is for increasing hole accumulation and charge transferal efficiencies, it should be doped in an advantageous manner to the efficiencies. Double doping may be unnecessary and a small thickness as in the surface p-type region 230 may be not required. In the latter case, a trap removal effect by the p doped region 332 beneath the gate oxide 320 can be maximized.

Figure 8:
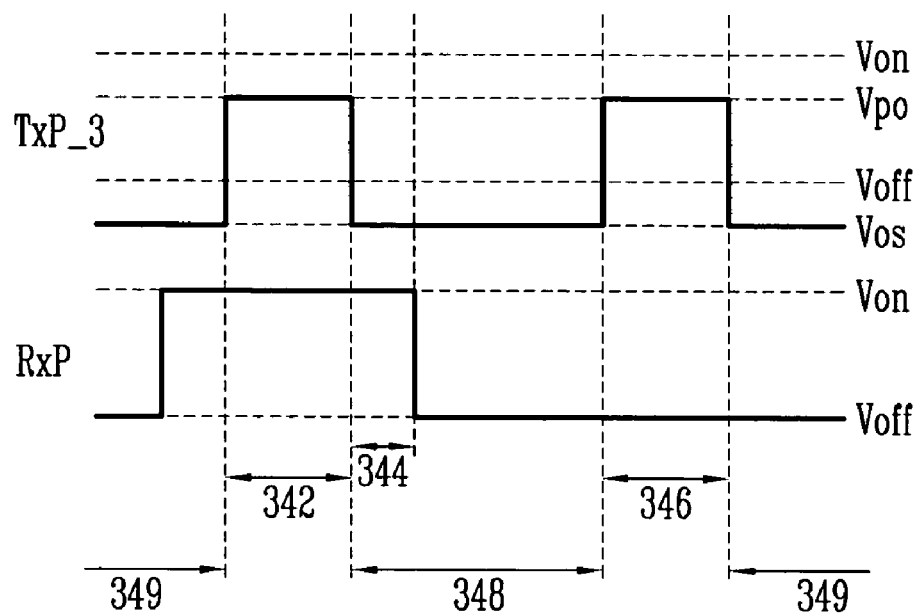
FIG. 8 is a timing diagram illustrating a method of driving a transfer transistor of an image sensor according to yet another exemplary embodiment of the present invention.

An example of a switching signal waveform for the enhancement of the transfer transistor and the advantages of the present invention is shown in FIG. 8. The waveform of the switching signal applies a negative (−) offset voltage Vos, not a ground voltage Voff, to the gate of the transfer transistor during the accumulation section 348 to accumulate photon-induced electrons. Even in the read section 349, the offset voltage Vos is applied, but another voltage such as the ground voltage Voff may be applied. The negative offset voltage is determined to be the most excellent trap inactivation point between about −0.1V and −1.0V to obtain optimal performance.

The offset voltage of the present invention must be a negative voltage having a smaller absolute value than the power supply voltage and requires a minor current, which makes it possible to easily configure a circuit for generating the offset voltage.

Figure 9:
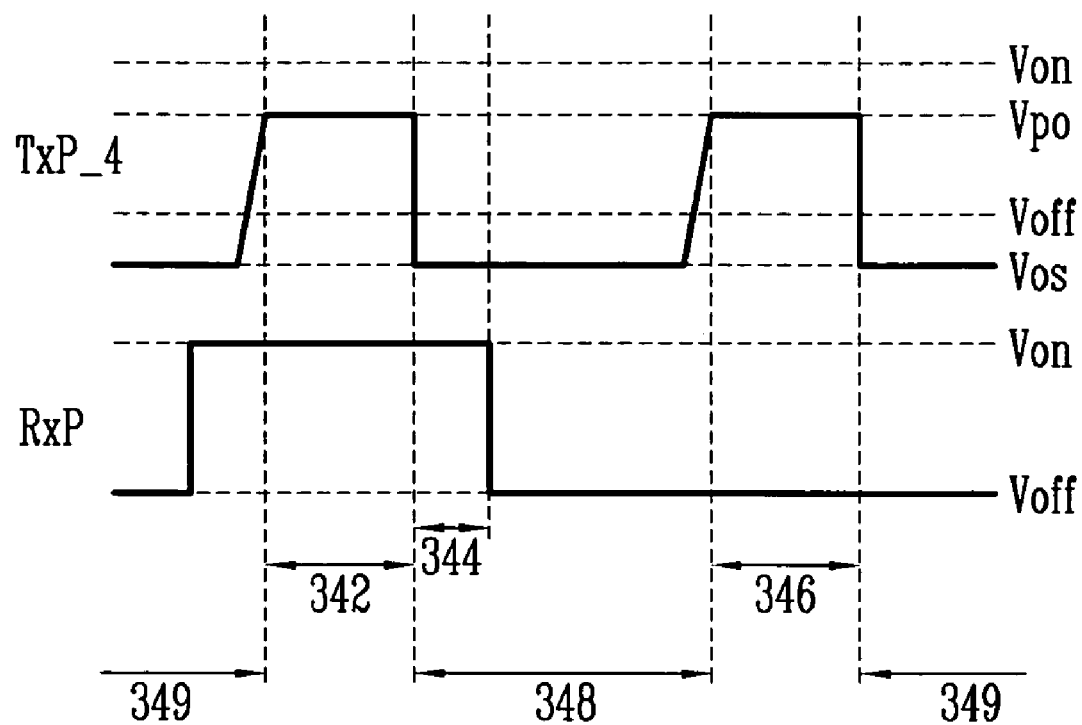
FIG. 9 is a timing diagram illustrating a method of driving a transfer transistor of an image sensor according to yet another exemplary embodiment of the present invention.

FIG. 9 shows a switching signal waveform including the enhancements of FIGS. 6 and 8. A negative offset voltage Vos is used as the turn-off voltage of the transfer transistor, and a pseudo pinch-off voltage is used as the turn-on voltage. A rising time from the negative offset voltage Vos to the pseudo pinch-off voltage Vpo is delayed by a separate delay means. An enhancement according to FIG. 9 can be inferred from the description of FIGS. 6 and 8.

Although in the third embodiment, the configuration according to the first embodiment and the configuration of applying the negative offset voltage have been combined, the configuration according to the second embodiment, which is simpler than the first embodiment configuration, and the configuration of applying the negative offset voltage may be combined.

For example, other switching signal waveforms including two or more features of the respective switching waveforms, including the switching signal waveforms shown in FIGS. 6 to 9, can be implemented, and a detailed description thereof can be inferred from the aforementioned description.

For example, although the present invention is implemented in a condition that the photodiode is partially depleted, it may be implemented in a condition that the photodiode is pinned. That is, reset and transfer operations can be performed independent of a voltage at a floating diffusion node by operating the transfer transistor in a pseudo pinch-off state even though the diode is pinned by a pinning voltage, thereby obtaining excellent characteristics.

According to the image sensor of the present invention, it is possible to effectively suppress dark current and other noises even in low operating voltage.

It is also possible to operate the transfer transistor in a pseudo pinch-off state without having to increase a voltage at the FD node.

It is also possible to easily improve performance of an image sensor by changing switching signals applied to a photodiode and a transfer transistor.

It is also possible to suppress dark current and other noises without need of a separate pinned photodiode having a fully depleted (or fully reset) structure.

While the invention has been shown and described with reference to certain exemplary embodiments thereof, it will be understood by those skilled in the art that various changes in forms and details may be made therein without departing from the spirit and scope of the invention as defined by the appended claims.

What is claimed is:

1. An image sensor comprising:
   a photodiode comprising an n-doped region and a p-doped region; and
   a transfer transistor comprising:
      a gate;
      a gate oxide layer underneath the gate;
      a channel underneath the gate oxide layer, the channel comprising a portion of a p-substrate;
      a source comprising the n-doped region of the photodiode wherein the p-doped region of the photodiode is between the gate oxide layer and the n-doped region of the photodiode; and
      a drain comprising a floating diffusion node composed of an n+-doped region, wherein the transfer transistor for transferring photon-induced charges created by the photodiode to the floating diffusion node,
   wherein the channel of the transfer transistor having a depletion region when the transfer transistor is turned on, so that the transfer transistor operates in a pseudo pinch-off mode.

2. The image sensor of claim 1, wherein the floating diffusion node and and the channel of the transfer transistor are separated by the depletion region by controlling a channel voltage of the transfer transistor to be lower than a voltage at the floating diffusion node during a partial or entire section of the turn-on section of the transfer transistor.

3. The image sensor of claim 2, further comprising a voltage control unit for controlling a turn-on voltage applied to the gate of the transfer transistor to be lower than the floating diffusion node voltage plus the threshold voltage of the transfer transistor.

4. The image sensor of claim 3, wherein the voltage control unit applies a switching signal having a pseudo pinch-off voltage lower than the power supply voltage to the gate of the transfer transistor during a partial or entire section of the turn-on section of the transfer transistor.

5. The image sensor of claim 4, wherein the pseudo pinch-off voltage ranges from a value several hundreds of mV lower than the power supply voltage to a half the power supply voltage.

6. The image sensor of claim 1, further comprising a voltage control unit for controlling the gate voltage of the transfer transistor to have a rising time two times or greater than a minimum rising time when the gate voltage rises from a turn-off voltage to a turn-on voltage.

7. The image sensor of claim 1, further comprising a reset transistor for resetting the floating diffusion node,
wherein a turn-on gate voltage higher than the power supply voltage is applied to a gate of the reset transistor, and the power supply voltage is applied as a turn-on gate voltage of the transfer transistor.

8. The image sensor of claim 7, wherein the turn-on gate voltage of the reset transistor ranges from a value several hundreds of mV higher than the power supply voltage to a value 1.5 times higher than the power supply voltage.

9. The image sensor of claim 7, wherein a drain voltage higher than the power supply voltage is applied to a drain of the reset transistor.

10. The image sensor of claim 1 wherein the p-doped region of the photodiode comprises a surface portion and a buried portion in which the buried portion of the p-doped region of the photodiode is directly underneath the gate oxide layer of the transfer transistor and directly is directly n-doped region of the photodiode.

11. The image sensor of any one of claims 1 to 9, wherein the transfer transistor has a structure capable of causing holes to be accumulated in a partial or entire region beneath the gate oxide layer.

12. The image sensor of claim 11, wherein a switching signal having a negative (-) offset voltage is applied to the gate during a partial or entire section of the turn-off section of the transfer transistor.

13. The image sensor of claim 12, wherein the negative offset voltage ranges from −0.1 V to −1.0 V.

14. The image sensor of claim 11, wherein the p-doped region of the photodiode is a surface p-type region, and the transfer transistor further comprises:
a p-type doping portion formed between the surface p-type region of the photodiode and a charge transmission channel from the photodiode to the diffusion node, and having a different doping pattern from the surface p-type region of the photodiode;
wherein the gate oxide layer is disposed on the p-type doping portion and the charge transmission channel; and
the gate is disposed on the gate oxide layer.

15. The image sensor of claim 1, wherein the floating diffusion node and the channel of the transfer transistor are separated by adjusting a process condition or layout during a manufacturing process of the image sensor.

16. The image sensor of claim 15, further comprising a reset transistor for resetting the floating diffusion node,
wherein the threshold voltage of the transfer transistor or the reset transistor is changed through a process condition modification so that the transfer transistor operates in a pseudo pinch-off mode.

17. The image sensor of claim 15, further comprising a reset transistor for resetting the floating diffusion node,
wherein the threshold voltage of the transfer transistor is made higher than the threshold voltage of the reset transistor by ion implantation or oxide layer thickness adjustment.

* * * * *